United States Patent [19]
Kouzuchi et al.

[11] Patent Number: 5,554,863
[45] Date of Patent: Sep. 10, 1996

[54] GATE TURN-OFF THYRISTOR

[75] Inventors: Sigeyasu Kouzuchi, Hitachi; Shuroku Sakurada, Katsuta; Takashi Saitoh, Hitachiota; Hitoshi Komuro, Hitachi, all of Japan

[73] Assignees: Hitachi, Ltd., Tokyo; Hitachi Haramachi Electronics Co., Ltd., Hitachi, both of Japan

[21] Appl. No.: 260,331

[22] Filed: Jun. 15, 1994

[30] Foreign Application Priority Data

Jun. 22, 1993 [JP] Japan .................. 5-150099

[51] Int. Cl.$^6$ .......................... H01L 29/74; H01L 31/111
[52] U.S. Cl. .................... 257/138; 257/147; 257/150; 257/166
[58] Field of Search .................... 257/138, 147, 257/143, 149, 150, 164, 165, 166

[56] References Cited

U.S. PATENT DOCUMENTS

| | | | |
|---|---|---|---|
| 4,443,810 | 4/1984 | Yatsuo et al. | 357/38 |
| 4,646,117 | 2/1987 | Temple . | |
| 4,868,625 | 9/1989 | Ujihara et al. . | |
| 4,996,586 | 2/1991 | Matsuda et al. | 357/74 |
| 5,140,406 | 8/1992 | Matsuda et al. | 357/74 |
| 5,146,305 | 9/1992 | Bernier | 357/38 |
| 5,198,882 | 3/1993 | Matsuda et al. | 357/37 |
| 5,346,849 | 9/1994 | Tokunoh | 437/66 |
| 5,360,985 | 11/1994 | Hiyoshi et al. | 257/181 |
| 5,393,995 | 2/1995 | Nakagawa et al. | 257/147 |

FOREIGN PATENT DOCUMENTS

| | | |
|---|---|---|
| 0366916 | 9/1989 | European Pat. Off. . |
| 2041727 | 8/1970 | Germany . |
| 3722425 | 7/1988 | Germany . |
| 4040751 | 12/1990 | Germany . |
| 55-071178 | 5/1980 | Japan . |
| 57-078172 | 5/1982 | Japan . |
| 58-034969 | 3/1983 | Japan . |
| 58-071658 | 4/1983 | Japan . |
| 60-189262 | 9/1985 | Japan . |
| 61-102065 | 5/1986 | Japan . |
| 1-032641 | 2/1989 | Japan . |
| 2-130960 | 5/1990 | Japan . |
| 2-292864 | 12/1990 | Japan . |
| 3-24764 | 2/1991 | Japan ................. 257/147 |
| 4-247661 | 9/1992 | Japan ................. 257/138 |

OTHER PUBLICATIONS

Research Disclosure, No. 295, Nov. 1988, "GTO Thyristor", pp. 879–880.

*Primary Examiner*—Ngân V. Ngô
*Attorney, Agent, or Firm*—Antonelli, Terry, Stout & Kraus

[57] ABSTRACT

A gate turn-off thyristor including: an n-type emitter semiconductor layer divided into a plurality of n-type areas; a p-type base semiconductor layer which cooperates with the n-type emitter semiconductor layer to form a first main circular surface; an n-type base semiconductor layer; and a p-type emitter semiconductor layer cooperating with the n-type base semiconductor layer to form a second main circular surface. An outer diameter of the p-type emitter semiconductor layer is smaller than that of the n-type emitter semiconductor layer. A first main electrode put in low resistance contact with the n-type emitter semiconductor layer is formed on the first main surface. A second main electrode put in low resistance contact with the p-type emitter layer and the n-type base semiconductor layer is formed on the second main surface. A control electrode is formed in the p-type base semiconductor on the first main surface. A first electrode plate larger in diameter than the n-type emitter semiconductor layer is connected electrically with the first main electrode. A second electrode plate larger in diameter than the n-type emitter semiconductor layer is connected electrically with the second main electrode.

17 Claims, 6 Drawing Sheets

DISTANCE FROM THE CENTER
OF SEMICONDUCTOR SUBSTRATE

GATE TURN-OFF THYRISTOR

BACKGROUND OF THE INVENTION

The present invention relates to gate turn-off thyristors (hereinafter referred to as GTO thyristors), and more particularly to a GTO thyristor suitable for a high speed operation.

A GTO thyristor switched (turned on/off) in accordance with a gating signal includes a semiconductor substrate which, in turn, having a pair of opposing main circular surfaces and four continuous pnpn-layers disposed between the main opposing surfaces. The pn-pn layers include an outer n-(emitter) layer and an intermediate p-(base) layer on a first one of the main surfaces and with a p-(emitter) layer and an intermediate n-(base) layer on a second one of the main surfaces. The n-emitter layer is divided into many strip-like areas disposed in a radial multi-concentric manner, while the p-emitter layer is divided into many areas such that when the n-emitter layer is projected onto the other main surface, the areas of the p-emitter layer overlap with the strip-like area of the n-emitter layer. Also included are main electrodes disposed on the cathode side of the substrate. The main electrodes are put in low resistance contact with respective areas of the n-emitter layer on the first main surface of the semiconductor substrate. An electrode is included on the anode side of the substrate and it is put in low resistance contact with the p-emitter and n-base layers on the other main surface of the semiconductor substrate. Control electrodes are put in low resistance contact with the p-base layer on the first main surface of the semiconductor substrate so as to surround the respective areas of the n-emitter. A cathode side electrode plate is electrically connected with the cathode side main electrodes. It has a diameter smaller than the semiconductor substrate and larger than the n-emitter layer. An anode side electrode plate is electrically connected with the anode side main electrode. It has a diameter smaller than the substrate and larger than the p-emitter layer. A control electrode lead is electrically connected with the control electrode at substantially center of the one main surface of the semiconductor substrate. (A GTO thyristor of this type is disclosed, for example, in JP-A-63-15464 (JP-B-6-1831)). The aforementioned GTO thyristor is enclosed within a package that includes a pair of block-like external electrodes and a cylindrical insulating ring, which connects the external electrodes with each other and which is supported between the external electrodes such that it is pressed by those external electrodes. The block-like external electrodes are smaller in diameter than the respective electrode plates so as to avoid stress concentration on the semiconductor substrate when the GTO thyristor is pressed. The external electrodes also function as a path which transmits heat generated in the semiconductor substrate to the outside of the package, for example, to cooling fins.

SUMMARY OF THE INVENTION

It is an objective of the present invention to provide a GTO thyristor having improved turn-off performance compared with GTO thyristors of the prior art even if the switching frequency is increased.

It is another objective of the present invention to provide a GTO thyristor which is capable of supplying a large, controllable electric current.

It is a further objective of the present invention to provide a GTO thyristor of a wafer pressing type having cooling effects superior to GTO thyristors known in the prior art.

In one aspect of the invention GTO thyristor is used as an inverter to control the speed of an electric motor. Traditionally, the switching frequency of an inverter tends to increase in order to smooth the rotation of the electric motor. However, as the switching (operating) frequency of the GTO thyristor increases, turn-off failure is likely to occur at a position remote from the control electrode lead, so that there is a limitation on an increase in the switching frequency. The inventors of the present invention have recognized that this tendency is likely to occur in a GTO thyristor of the wafer-pressing, where the semiconductor substrate is directly pressed between the external electrodes.

In the GTO thyristor of the present invention, rises in the temperature at the peripheral portions of the semiconductor substrate during operation are substantially the same as that at the center of the semiconductor substrate. This is accomplished by making (1) the p-emitter layer different in diameter from the n-emitter layer; (2) carriers in the peripheral portions of the semiconductor substrate shorter in lifetime than those at the center of the substrate; and (3) impurity density in the p-emitter layer in the peripheral portions of the semiconductor substrate lower than that at the center of the semiconductor substrate.

Heat loss occurs between the n-emitter layer composed of many areas, and the p-emitter layer, which is formed opposite to the n-emitter layer. As far as the semiconductor substrate is concerned, the heat produced in the substrate is considered to be uniform. However, if cooling the GTO thyristor, including its package which contains the semiconductor substrate, is considered, a pair of metal plates which is put in contact with the semiconductor substrate and a pair of block-like external electrodes which are put in contact with the pairs of metal plates and the cooling fins contribute to cooling. The metal plates are not sufficiently large several (mm or more smaller than the diameter of the semiconductor substrate even at a maximum, and a little larger in diameter than the n-emitter layer or the p-emitter layer in consideration of a stabilizing member which covers the side of the semiconductor substrate). The block-like external electrodes are smaller in diameter than the metal plates so as to avoid stress concentration in the semiconductor substrate when the block-like external electrodes are pressed. Thus, heat produced in the peripheral portions of the semiconductor substrate is difficult to radiate compared to the inner portion of the semiconductor substrate. As a result the temperature of the peripheral portions of the semiconductor substrate is raised, which makes the turn-off difficult and causes current concentration.

In the present invention, a rise in the temperature in the operating state of the GTO thyristor in the peripheral portions of the semiconductor substrate is caused to be substantially the same as that at the center of the semiconductor substrate. This prevents the partial occurrence of the positions difficult for the turn-off in the semiconductor substrate, and thereby prevents the concentration of the electric current and the turn-off failure.

According to the present invention, since a local rise in the temperature when the element operates is suppressed to thereby make the temperature distribution in the substrate uniform, sufficient cooling effect is obtained to thereby provide an element operable at a switching frequency higher than several hundreds of hertz.

DESCRIPTION OF THE PREFERRED EMBODIMENTS

The GTO thyristor of the present invention will be described below with reference to the accompanying drawings, which show various preferred embodiments of the GTO of the present invention.

Figure 1:
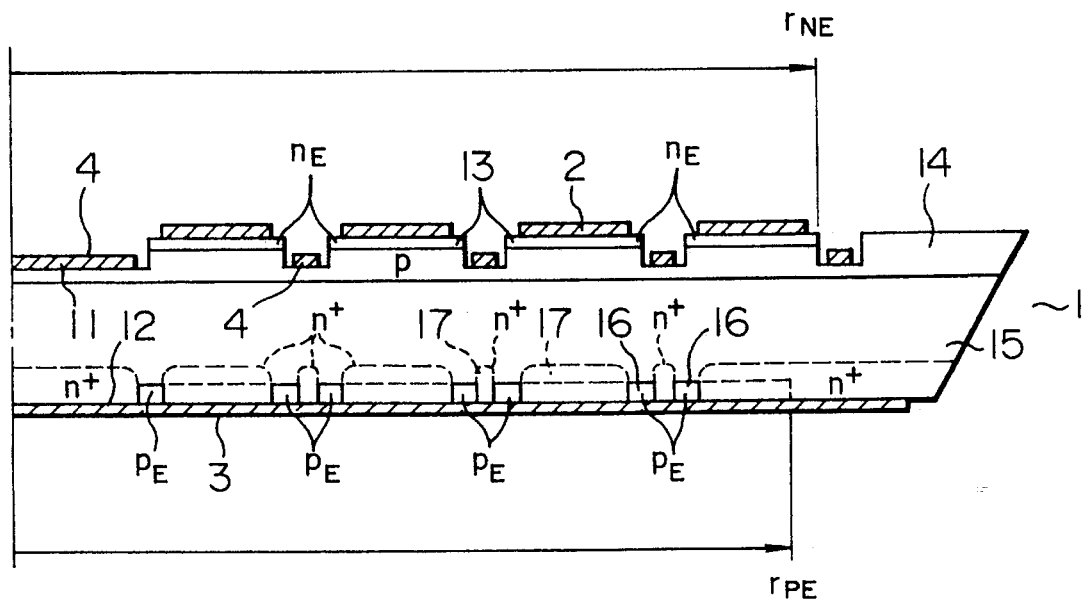
FIG. 1 is a diagrammatic cross-sectional view of a typical embodiment of the inventive GTO thyristor.
Figure 2:
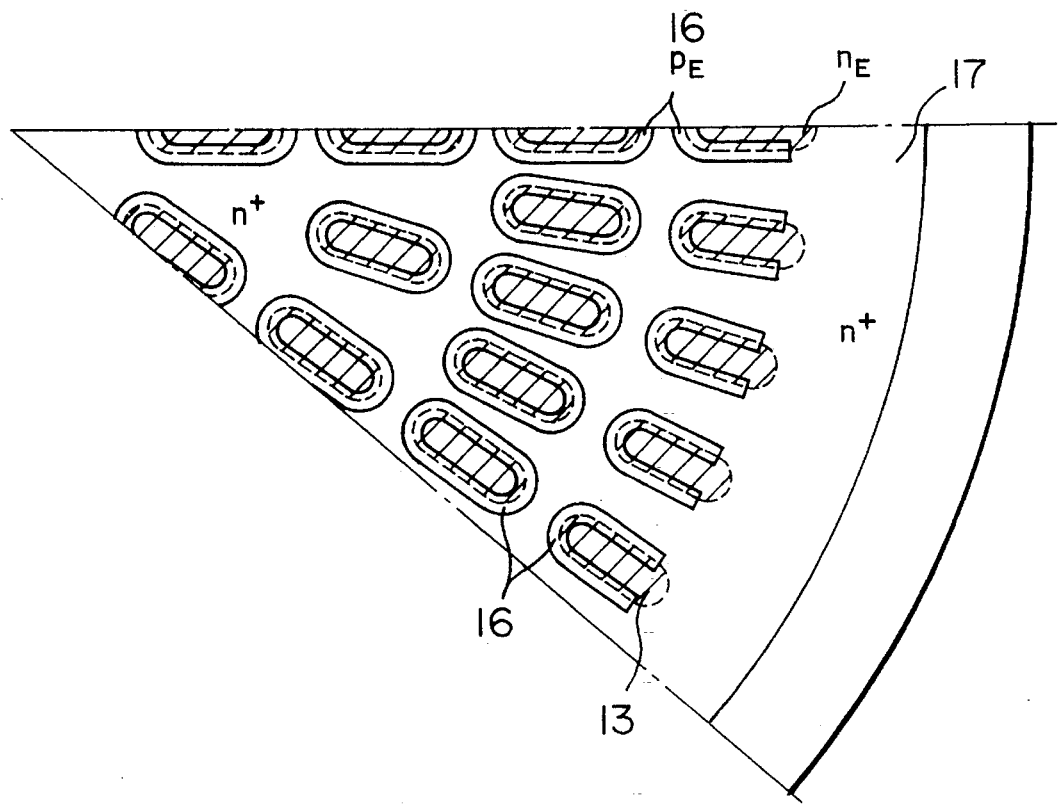
FIG. 2 is a partial plan view of the GTO thyristor of FIG. 1 as viewed from the anode side.

FIG. 1 is a cross-sectional view of a preferred embodiment of a GTO thyristor. The GTO thyristor shown is, for example, an anode-short-type GTO thyristor. Reference numeral 1 in FIG. 1 denotes a disc-like semiconductor substrate having a pair of main opposite circular surfaces 11 and 12, and four continuous pnpn-layers between the main surfaces. The four pn-pn layers include an emitter layer 13 adjacent to one main surface 11, a p-base layer adjacent to the one main surface 11 and the n-emitter layer 13, an n-base layer 15 adjacent to the p-base layer 14 and a p-emitter layer 16 adjacent to the n-base layer 15 and the other main surface 12, and an n$^+$-layer 17 adjacent to the n-base layer 15, p-emitter layer 16 and other main surface 12. The n-emitter layer 13 is divided into many strip-like areas disposed radially in a multi-concentric manner. As shown in FIG. 2, the p-emitter layer 16 is divided into many areas which are disposed so as to overlap with the strip-like areas of the n-emitter layer 13 when the n-emitter 13 is projected onto the other main surface 12. The p-emitter layer is disposed radially in a multi-concentric manner similarly the n-emitter layer. More specifically, the p-emitter layer 16 takes the form of a strip which has a central elongated depression region. The depression region and the adjacent p-emitter layer 16 overlap with a strip-like area of the n-emitter layer 13. The n$^+$ layer is disposed at the depression region of the p-emitter layer 16 and at the periphery of the p-emitter layer. The outer diameter $r_{PE}$ of the p-emitter layer 16 is selected so as to be smaller than the outer diameter $r_{NE}$ of the n-emitter layer 13. As a result, the outermost areas of the p-emitter layer 16 take the form of a U. As a result, the respective outermost areas of the p-emitter 16 have a smaller area than the inner areas thereof.

Reference numeral 2 denotes cathode electrodes put in low resistance contact with the respective strip-like areas of the n-emitter layer 13 on the one main surface 11 of the substrate 1. Reference numeral 3 denotes an anode electrode put in low resistance contact with the p-emitter layer and n$^+$-layer 17 on the other main surface 12 of the substrate 1. Reference numeral 4 denotes gate electrodes put in low resistance contact with the p-base layer 14 on the one main surface 11 of the semiconductor substrate 1 so as to surround the respective strip-like areas of the n-emitter layer 13.

Figure 3:
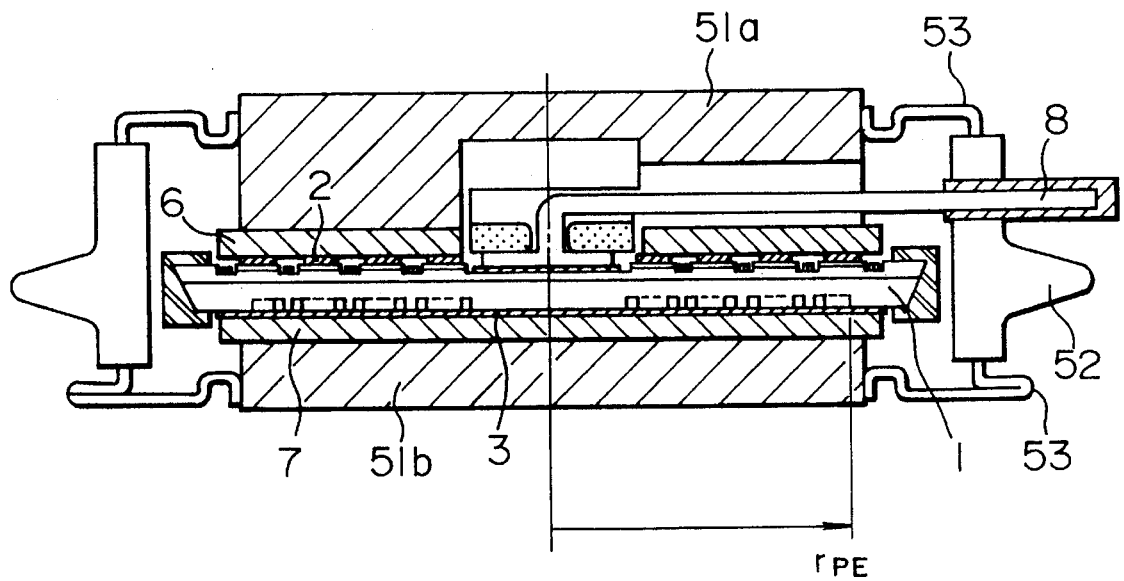
FIG. 3 is a diagrammatic cross-sectional view of the GTO thyristor of FIG. 1 enclosed in a package.

The GTO thyristor, thus constructed, may be enclosed in a package 5 of the type shown in FIG. 3. Package 5 is provided with a pair of block-like external electrodes 51a, 51b; cylindrical insulating rings 52 which electrically isolate the pair of external electrodes 51a, and 51b; metal flanges 53 each of which connects the pair of external electrodes 51a, 51b and the corresponding cylindrical insulating ring 52 in an airtight manner. Reference numeral 6 denotes a cathode electrode plate provided between the one block-like external electrode 51a and the cathode electrode 2 such that the cathode electrode plate 6 is pressed by the members 51a and 2. Reference numeral 7 denotes an anode electrode plate provided between the other block-like external electrode 51b and the anode electrode 3 such that the anode electrode plate 7 is pressed by the elements 51b and 3. Reference numeral 8 denotes an gate electrode lead connected electrically with the gate electrode and led to the outside of the package 5 through a space formed in the one block-like external electrode 51a and a hole formed in the cylindrical insulating ring 52. The cathode electrode 6 and anode electrode 7 each have a diameter equal to or slightly larger than the external diameter $r_{NE}$ of the n-emitter layer 13. The block-like external electrodes 51a, 51b each have a diameter smaller than the outer diameter of the cathode electrode 6 and anode electrode 7 to prevent stress concentration on the substrate 1 when they press the substrate 1.

Figure 4:
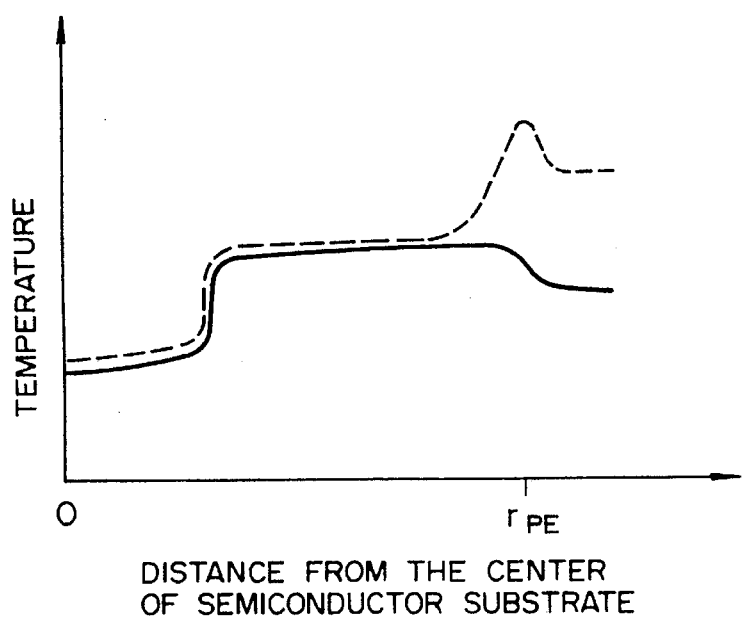
FIG. 4 shows radial temperature distributions in the semiconductor substrates of the GTO thyristor of FIG. 1 and a conventional GTO thyristor.

The GTO thyristor of FIG. 1 may advantageously be used in a package of the type shown in FIG. 3. Thus, even if the switching frequency is increased, no turn-off failure occurs to thereby increase its controllable electric current for the following reasons. When the GTO thyristor of FIG. 1 is in a conductive state, the respective outermost areas of the p-emitter 16 are smaller in area than its inner areas and hence the density of an electric current in the inner portions of the semiconductor substrate 1 is larger than that in the outermost portions of the substrate 1. Since an amount of heat produced in the substrate is directly proportional to the square of its current density, the outermost peripheral portion of the semiconductor substrate 1 is smaller in amount of heat per unit area than the other portion of the substrate 1. Even if the amount of heat radiated to the cooling fins from the semiconductor substrate 1 through the cathode electrode 2 and anode electrode 3, cathode electrode 6 and anode electrode 7, and the block-like external electrodes 51a, 51b is smaller in the outer-most peripheral portion of the semiconductor substrate 1 than that in the inner portion of the substrate 1, the amount of heat per unit area produced in the outer-most peripheral portion of the substrate 1 is smaller than that in the inner portion of the substrate 1. Thus, the whole semiconductor substrate 1 is cooled substantially uniformly. As a result, a rise in the temperature in the semiconductor substrate 1 is substantially uniform throughout the whole substrate 1, as shown by the solid line in FIG. 4. Thus, in the outer peripheral portion, no concentration of an electric current occurs, and hence no turn-off failure occurs.

While in FIG. 1 the outer diameter $r_{PE}$ of the p-emitter layer 16 is shown as being smaller than the outer diameter $r_{NE}$ of the n-emitter layer 13, the outer diameter $r_{NE}$ of the n-emitter layer 13 may be conversely smaller than the outer diameter $r_{PE}$ of the p-emitter layer 16 and an amount of heat produced per unit area in the outermost peripheral portion of the semiconductor substrate 1 may be smaller than the other area of the semiconductor substrate 1. However, the former case is preferable for the following reason. When the outer diameter $r_{PE}$ of the p-emitter layer 16 is smaller than the outer diameter $r_{NE}$ of the n-emitter layer 13, no current expands to the peripheral area of the n-emitter layer 13 with which the gate electrode 4 is put in contact whereas when the outer diameter $r_{NE}$ of the n-emitter layer 13 is smaller than the outer diameter $r_{PE}$ of the p-emitter layer 16, a current expands to the peripheral area of the n-emitter layer 13 with which the gate electrode 4 is put in contact. The gate electrode 4 is remote from the cathode electrode plate 6 and the block-like external electrode 51a and has no function of heat radiation, so that the latter case is smaller in the heat radiation effect of the outermost peripheral portion of the semiconductor substrate than the former case. As a result, the former case is excellent compared to the latter case in order to achieve the effect of the present invention.

Figure 5:
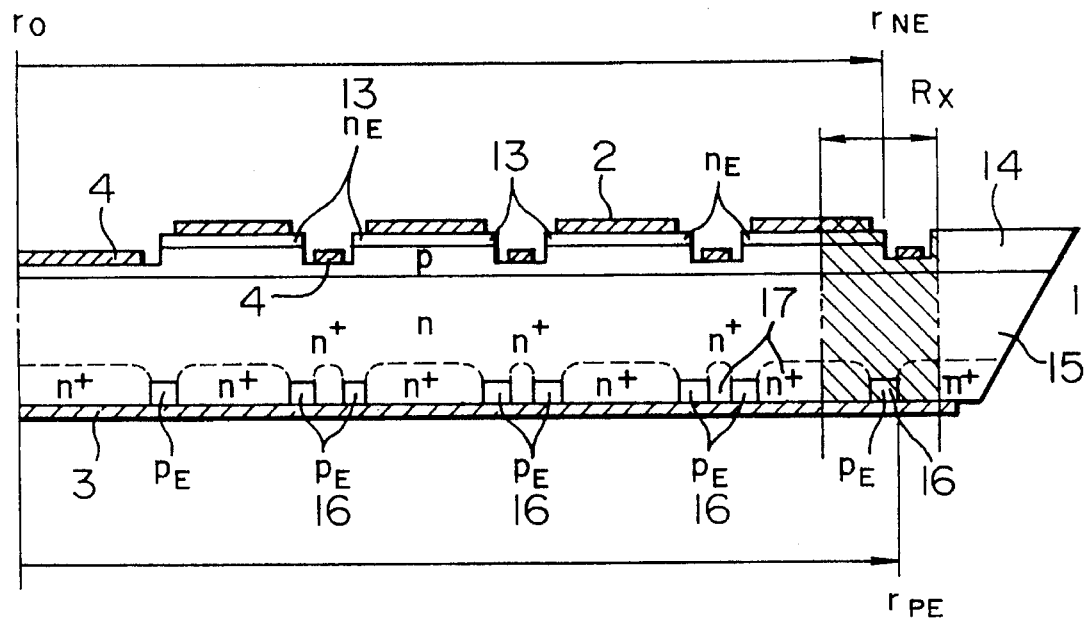
FIG. 5 is a diagrammatic cross-sectional view of another embodiment of the inventive GTO thyristor.
Figure 6:
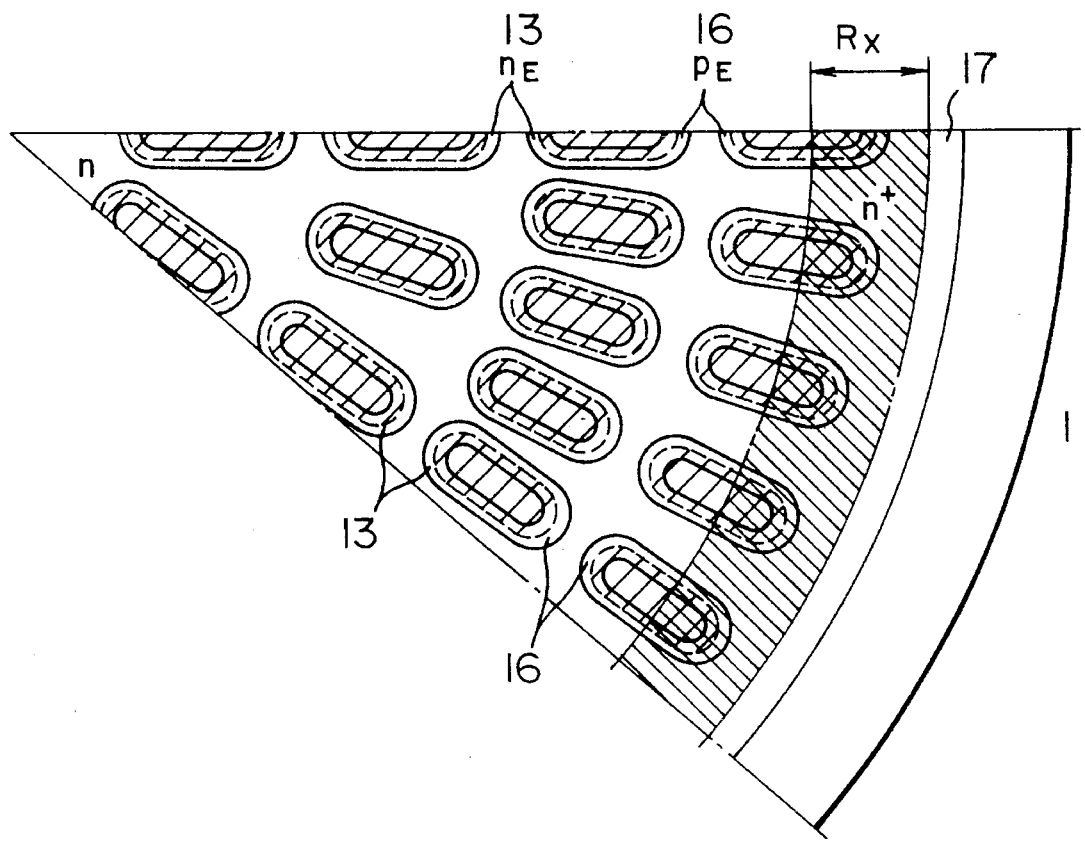
FIG. 6 is a partial plan view of the GTO thyristor of FIG. 5 as viewed from the anode side.

FIGS. 5 and 6 are a diagrammatic cross-sectional view and a partial plan view, respectively, of another embodiment of the inventive GTO thyristor. The GTO thyristor of FIGS. 5 and 6 is different from that of FIG. 1 in that the outer diameter $r_{PE}$ of the p-emitter layer 16 is substantially equal to the outer diameter $r_{NE}$ of the n-emitter layer 13 and that the outermost peripheral portion of the semiconductor substrate 1 is shorter in carrier lifetime than the other portion of the semiconductor substrate 1, by doping with a heavy metal such as gold or platinum in a portion Rx of FIGS. 5 and 6 or irradiating the portion Rx with an electron beam or a gamma ray. Thus, when the GTO thyristor is operated, the portion Rx is higher in on-voltage than the other portions, so that the density of the electric current is smaller than the other portion accordingly. As a result, an amount of heat produced in the portion Rx is smaller than that in the other portions. Thus, even if the inner portion of the semiconductor substrate 1 is larger in heat radiation effect than that of the outermost peripheral portion of the substrate 1, a rise in the temperature is substantially uniform throughout the semiconductor substrate 1. Thus, a GTO thyristor is realized which brings about no turn-off failure in the peripheral portions of the semiconductor substrate. Also, in this embodiment, the GTO thyristor used is also enclosed in the package 5, as shown in FIG. 3. Further, in this embodiment, in the region between the outermost peripheral portion of the p-emitter layer and the edge surface of the semiconductor substrate excluding the region adjacent to the edge surface, the lifetime is controlled. So, in the region adjacent to the edge surface, the crystal defects are not caused for the control of the lifetime. Accordingly, in this embodiment, even if the lifetime is controlled in the outermost peripheral portion of the semiconductor substrate, the increase of the leak current and the deterioration of the withstand voltage are not caused.

Figure 7:
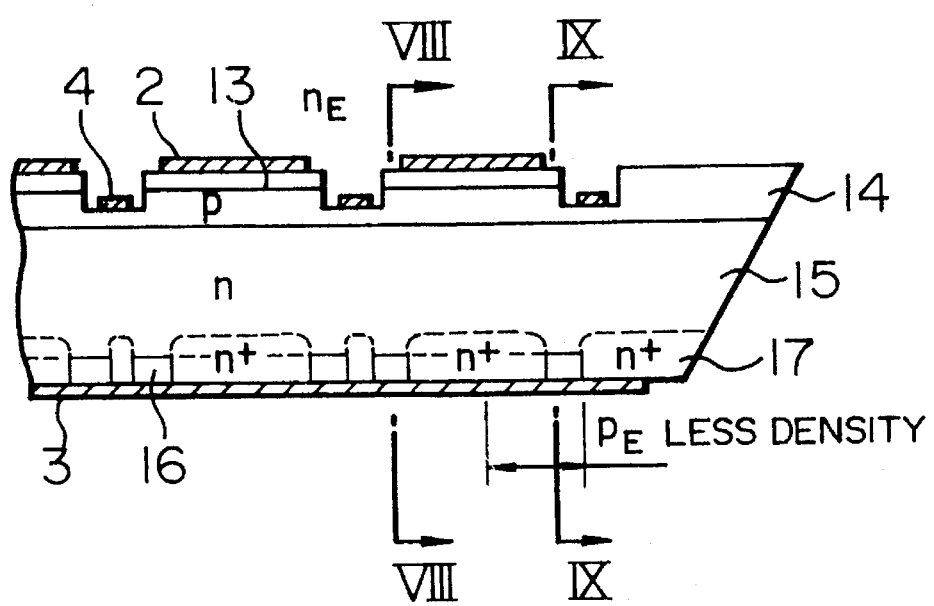
FIG. 7 is a diagrammatic cross-sectional view of a further embodiment of the inventive GTO thyristor.
Figure 8:
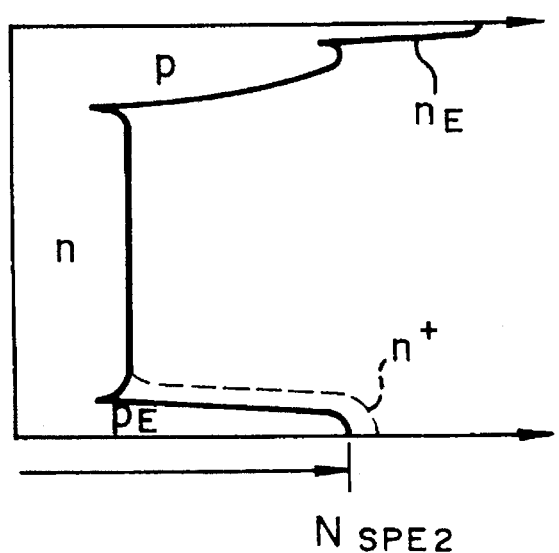
FIG. 8 is an impurity concentration distribution diagram of the GTO thyristor taken along its lines VIII—VIII in FIG. 7.
Figure 9:
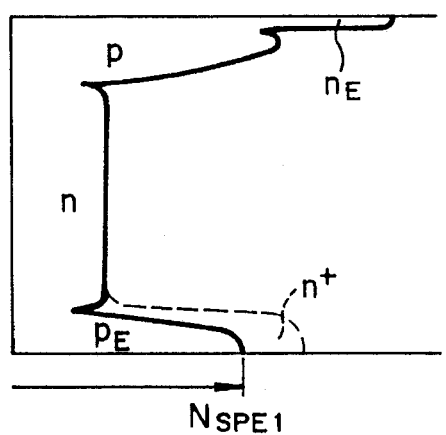
FIG. 9 is an impurity concentration distribution diagram of the GTO thyristor taken along its lines IX—IX in FIG. 7.

FIG. 7 is a diagrammatic cross-sectional view of still another embodiment of the inventive GTO thyristor. This GTO thyristor differs from that of FIG. 1 in that the outer diameter $r_{PE}$ of the p-emitter layer 16 is substantially equal to the diameter $r_{NE}$ of the n-emitter layer 13, and that the impurity density in the outermost peripheral areas of the p-emitter layer 16 is lower than that in the other portions of the p-emitter layer 16. FIG. 8 shows an impurity density distribution taken along the line VIII—VIII of FIG. 7, and FIG. 9 shows an impurity density distribution taken along the line IX—IX of FIG. 7. While the impurity density $N_{SPE2}$ of the p-emitter layer 16 is close to that of the $n^+$-layer in the region except the outermost peripheral area shown in FIG. 8, the impurity density $N_{SPE1}$ of the p-emitter layer 16 is considerably lower than that of the $n^+$-layer in the outermost peripheral area shown in FIG. 9. Here, the value of $N_{SPE1}$ is smaller than that of $N_{SPE2}$. This causes the efficiency of holes injected from the p-emitter layer 16 to the n-base layer 15 to increase in the p-emitter layer 16 having the impurity density $N_{SPE2}$ to make more easier the flow of an electric current therein while this causes the efficiency of holes injected from the p-emitter layer 16 to the n-base layer 15 to decrease in the p-emitter layer 16 having the impurity density $N_{SPE1}$ to make more difficult the flow of an electric current therein. Thus, even if the heat radiation in the inner portion of the semiconductor substrate 1 is larger than that in the outermost peripheral portion of the semiconductor substrate 1, the density of an electric current in the outermost peripheral portion of the semiconductor substrate 1 and the amount of heat produced are small. Thus, a rise in the temperature throughout the semiconductor substrate 1 is substantially uniform. Thus, a GTO thyristor is realized which causes no turn-off failure in the peripheral portions of the substrate 1. Also, in this embodiment, the GTO thyristor used is enclosed in a package 5, as shown in FIG. 3.

Figure 10:
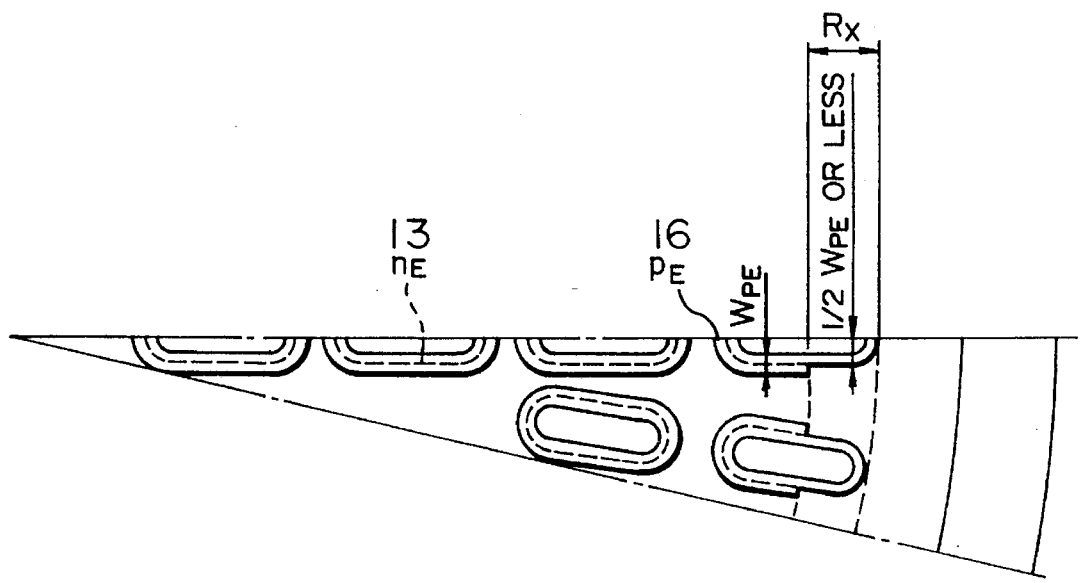
FIG. 10 is a partial plan view of another embodiment of the inventive GTO thyristor.

FIG. 10 is a diagrammatic plan view of another embodiment of the inventive GTO thyristor. The GTO thyristor of FIG. 10 is different from that of FIG. 1 in that the outer diameter $r_{PE}$ of the p-emitter layer 16 is substantially equal to the diameter $r_{NE}$ of the n-emitter layer 13, and that the outermost peripheral areas of the p-emitter layer 16 are different in shape from the inner areas of the p-emitter layer 16 or that the outermost peripheral areas of the p-emitter layer 16 on the semiconductor substrate 1 are smaller in width than the inner areas of the p-emitter layer 16 by modifying the outer configuration of the outermost peripheral areas of the p-emitter layer 16. This causes the injection efficiency of holes in the outer peripheral portion of the outermost areas of the p-emitter layer 16 on the substrate 1 to be lower than that in the inner portion of the outermost areas. Thus, a rise in the temperature throughout the semiconductor substrate 1 is substantially uniform for a reason similar to that in the embodiment of FIG. 8 to thereby provide a GTO thyristor where no turn-off failure occurs in the periphery of the semiconductor substrate 1. Also, in this embodiment, the GTO thyristor used is enclosed in a package 5, as shown in FIG. 3.

Figures 11A, 11B, 11C:
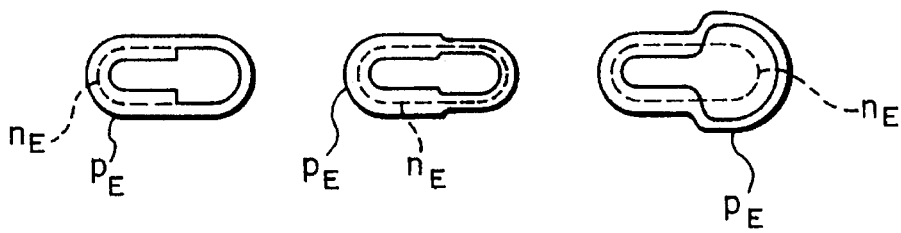
FIGS. 11A–11C each are a diagrammatic plan view of a modification of the GTO thyristor of FIG. 10.

FIGS. 11A–11C each are a diagrammatic plan view of a modification of the GTO thyristor of FIG. 10. FIGS. 11A–11C each show the outermost one of the respective divided areas of the p-emitter layer 16. FIG. 11A shows an outermost area where its central cavity size and hence its width of the outer peripheral portion of the area are changed; FIG. 11B shows an outer-most area where its central cavity size and its outer peripheral configuration are modified to thereby change its width of the outer peripheral portion of the substrate; and FIG. 11C shows an outermost area where its peripheral width is changed and its radius of curvature is increased.

Figure 12:
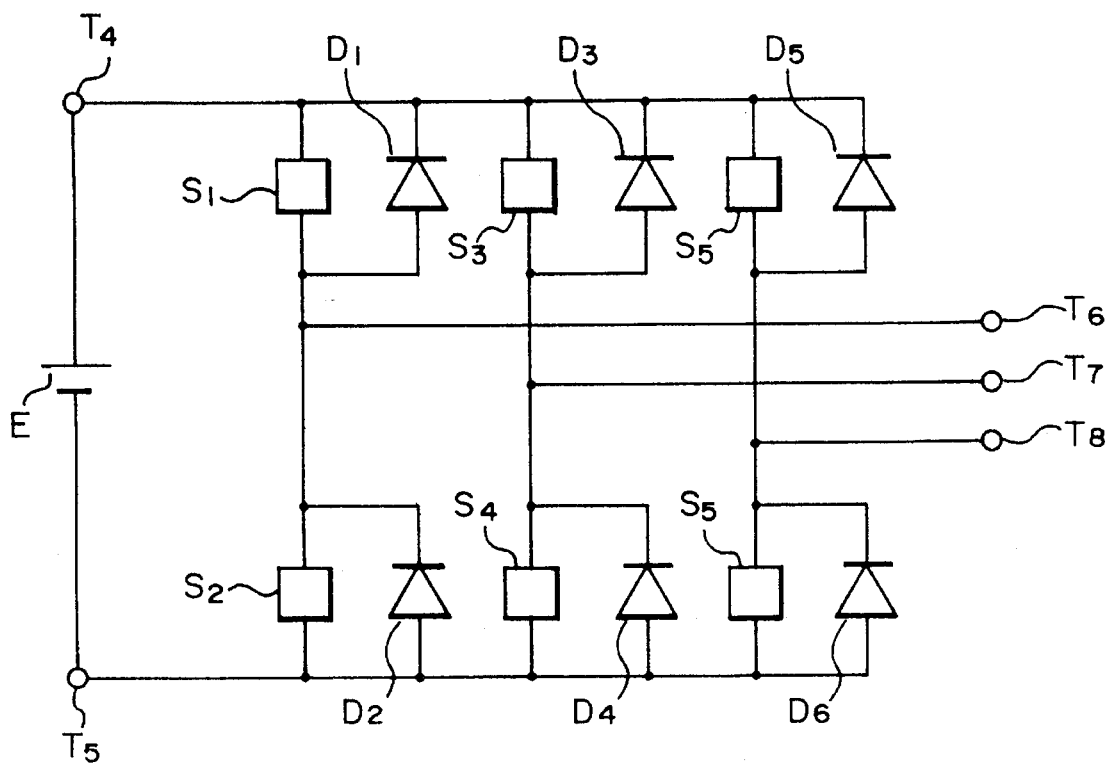
FIG. 12 is a circuit diagram of a three-phase invertor which uses the inventive GTO thyrister as a switching element.

FIG. 12 is a circuit diagram of an embodiment of a three-phase invertor using the inventive GTO thyrister. In FIG. 12, reference character $T_4$ and $T_5$ denote direct current terminals connected to a direct current power supply E; sets of $S_1$ and $S_2$, $S_3$ and $S_4$, $S_5$ and $S_6$ each series connected switching elements each including the inventive GTO thyristor, the sets of $S_1$ and $S_2$, $S_3$ and $S_4$, $S_5$ and $S_6$ each being connected in parallel with the same polarity between the pair of direct current terminals $T_4$ and $T_5$; $D_1$–$D_6$ each a diode connected in parallel with the corresponding switching element in opposite polarity relation such that the load current circulates therethrough; $T_6$–$T_8$. AC terminals which are the same in number (3) as the phases of AC outputs each led from the junction point of the corresponding two series connected switching elements. Such application of the inventive GTO thyristors to the inverter switching elements serves to increase the switching frequency of the switching elements to thereby output a waveform whose possible distortion is reduced.

What is claimed is:

1. A gate turn-off thyristor comprising:

an n-type emitter semiconductor layer divided into a plurality of n-type areas disposed in concentric rows, with each row including a plurality of the n-type areas;

a p-type base semiconductor layer which cooperates with the n-type emitter layer to form a first main circular surface;

a p-type emitter semiconductor layer divided into a plurality of p-type areas disposed in concentric rows with each of said rows including a plurality of said p-type areas, each p-type area residing in an outermost concentric row of said rows of p-type areas overlapping with a respective n-type area in an outermost concentric row of said rows of n-type areas when said p-type areas are projected onto the first main circular surface, said outermost concentric row of p-type areas having a diameter smaller than a diameter of the outermost row of said n-type areas, the p-type areas in said remaining concentric rows overlapping with respective n-type areas in corresponding remaining concentric rows of n-type areas when said p-type areas are projected onto the first main circular surface, said remaining rows of p-type areas having diameters which are at least as large as diameters of corresponding remaining rows of n-type areas;

an n-type base semiconductor layer formed between said p-type base layer and said p-type emitter layer, said n-type base layer cooperating with the p-type emitter layer to form a second main circular surface;

a first main electrode formed in low resistance contact with the n-type emitter layer on the first main surface;

a second main electrode formed in low resistance contact with the p-type emitter layer and the n-type base layer on the second main surface;

a control electrode formed in the p-type base semiconductor so as to surround the n-type emitter layer on the first main surface;

a first electrode plate connected electrically with the first main electrode;

a second electrode plate connected electrically with the second main electrode.

2. A gate turn-off thyristor according to claim 1, wherein said p-type emitter layer is formed in a strip having a central elongated depression region.

3. A gate turn-off thyristor comprising: an n-type emitter semiconductor layer divided into a plurality of n-type areas disposed in concentric rows, with each of said rows including a plurality of said n-type areas;

a p-type base semiconductor layer which cooperates with the n-type emitter layer to form a first main circular surface;

a p-type emitter semiconductor layer divided into a plurality of p-type areas disposed in concentric rows, with each of said rows including a plurality of p-type areas;

an n-type base semiconductor layer formed between said p-type base layer and said p-type emitter layer, said n-type base layer cooperating with the p-type emitter layer to form a second main circular surface;

a first main electrode formed in low resistance contact with the n-type emitter layer on the first main surface;

a second main electrode formed in low resistance contact with the p-type emitter layer and the n-type base layer on the second main surface;

a control electrode formed in the p-type base semiconductor so as to surround the n-type emitter layer on the first main surface;

a first electrode plate connected electrically with the first main electrode;

a second electrode plate connected electrically with the second main electrode; and means for producing a uniform temperature rise in all of said layers when said thyristor enters a conductive state, said uniform rise being effectuated by reducing current density of a current flowing between outermost concentric rows of said n-type and p-type areas, said reduction being accomplished by having a diameter of an outermost row of said p-type areas smaller than a diameter of an outermost row of said n-type areas, and by having the p-type areas in said outermost row of p-type areas overlap with respective n-type areas in said outermost rows of n-type areas, wherein remaining concentric rows of p-type areas having diameters which are at least as large as diameters of corresponding remaining rows of n-type areas.

4. A gate turn-off thyristor as recited in claim 1, wherein the p-type areas within said outermost concentric row have substantially a U-shape.

5. A gate turn-off thyristor as recited in claim 3, wherein the p-type areas within said outermost concentric row have substantially a U-shape.

6. A gate turn-off thyristor comprising:

a plurality of n-type emitter semiconductor layer groups disposed in multi-concentric manner, each of said n-type emitter semiconductor layer groups being divided into a plurality of n-type areas so that the divided n-type areas are disposed radially;

a p-type base semiconductor layer which cooperates with said n-type emitter semiconductor layer groups to form a first main circular surface;

an n-type base semiconductor layer;

a plurality of p-type emitter semiconductor layer groups disposed in multi-concentric manner, said plurality of p-type emitter semiconductor layer groups including areas which individually overlap with respective ones of said plurality of n-type areas of said n-type emitter semiconductor layer groups when projected on said first main circular surface, one of said p-type emitter semiconductor layer groups positioned on an outermost periphery of the plurality of p-type emitter semiconductor layer groups having an outer diameter smaller than that of a corresponding one of said n-type emitter semiconductor layer groups, said one of said p-type emitter semiconductor layer groups forming said individual overlapped areas with corresponding n-type areas of said corresponding one of said n-type emitter semiconductor layer groups, plural ones of said p-type emitter semiconductor layer groups positioned on inner peripheries respectively having outer diameters not smaller than that of corresponding ones of said n-type emitter semiconductor layer groups, said plural ones of said p-type emitter semiconductor layer groups forming said individually overlapping areas respectively with corresponding n-type areas of said corresponding ones of said n-type semiconductor layer groups, said plurality of p-type emitter semiconductor layer groups cooperating with said n-type base semiconductor layer to form a second main circular surface;

a first main electrode formed in low resistance contact with said plurality of n-type areas on the first main surface;

a second main electrode formed in low resistance contact with said plurality of p-type emitter semiconductor layer groups and said n-type base semiconductor layer on the second main surface;

a control electrode formed in said p-type base semiconductor layer on the first main surface;

a first electrode plate connected electrically with said first main electrode; and a second electrode plate connected electrically with said second main electrode.

7. A gate turn-off thyristor according to claim 6, wherein said corresponding one of said n-type emitter semiconductor layer groups which forms said overlapped areas with said one of said p-type emitter semiconductor layer groups positioned on the outermost periphery is positioned on an outermost periphery of said plurality of n-type emitter semiconductor groups.

8. A gate turn-off thyristor according to claim 6, wherein only said one of p-type emitter semiconductor layer groups positioned on the outermost periphery has the outer diameter smaller than that of said corresponding one of said n-type emitter semiconductor later groups, said one of p-type emitter semiconductor layer groups forming the individually overlapped areas with said corresponding areas of said n-type emitter semiconductor layer groups.

9. A gate turn-off thyristor according to claim 6, wherein each of said plurality of p-type emitter semiconductor layer groups is divided into a plurality of p-type areas.

10. A gate turn-off thyristor according to claim 9, wherein a planar dimension of each p-type area of ones of said plurality of p-type emitter semiconductor layer groups positioned on inner peripheries is substantially equal to one another, and is larger than that of each p-type area of said one of said plurality of p-type emitter semiconductor layer groups positioned on the outermost periphery.

11. A gate turn-off thyristor according to claim 9, wherein said each p-type area is of a strip shape having a central elongated depression region.

12. A gate turn-off thyristor comprising:

a plurality of n-type emitter semiconductor layer groups disposed in multi-concentric manner, each of said n-type emitter semiconductor layer groups being divided into a plurality of n-type areas so that the divided n-type areas are disposed radially;

a p-type base semiconductor layer which cooperates with said n-type emitter semiconductor layer groups to form a first main circular surface;

an n-type base semiconductor layer;

a plurality of p-type emitter semiconductor layer groups disposed in multi-concentric manner, said plurality of p-type emitter semiconductor layer groups including p-type areas which individually overlap with respective areas of said plurality of n-type emitter semiconductor layer groups when projected on said first main circular surface, said plurality of p-type emitter semiconductor layer groups cooperating with said n-type base semiconductor layer to form a second main circular surface;

a first main electrode formed in low resistance contact with said plurality of n-type areas on the first main surface;

a second main electrode in low resistance contact with said plurality of p-type emitter semiconductor layer groups and said n-type base semiconductor layer on the second main surface;

a control electrode formed in said p-type base semiconductor on the first main surface;

a first electrode plate connected electrically with said first main electrode;

a second electrode plate connected electrically with said second main electrode; and means for reducing a first current density of a current flowing between one of said p-type emitter semiconductor layer groups positioned on an outermost periphery of the p-type emitter semiconductor layer groups and a corresponding one of said n-type emitter semiconductor layer groups, said one of said p-type emitter semiconductor layer groups forming the individually overlapped areas with corresponding n-type areas of said corresponding one of said n-type emitter semiconductor layer groups, to make said first current density smaller than second current densities of currents flowing between p-type emitter layer groups in an inner peripheral side and corresponding ones of the n-type emitter layer groups, and for making the second current densities in the inner peripheral side substantially equal.

13. A gate turn-off thyristor according to claim 12, wherein said corresponding one of said n-type emitter semiconductor layer groups which forms said overlapped areas with said one of said p-type emitter semiconductor layer groups positioned on the outermost periphery is positioned on an outermost periphery of the n-type emitter semiconductor layer groups.

14. The gate turn-off thyristor according to claim 12, wherein each of said plurality of p-type emitter semiconductor layer groups is divided into a plurality of p-type areas.

15. The gate turn-off thyristor according to claim 14, wherein said each p-type area is of a strip shape having a central elongated depression region.

16. The gate turn-off thyristor according to claim 1, wherein the p-type areas of the remaining concentric rows completely overlap outer peripheries of said corresponding n-type areas.

17. The gate turn-off thyristor according to claim 3, wherein the p-type areas of the remaining concentric rows completely overlap outer peripheries of said corresponding n-type areas.

* * * * *